United States Patent [19]
Ohmi et al.

[11] Patent Number: 5,645,943
[45] Date of Patent: Jul. 8, 1997

[54] ELECTRIFIED OBJECT CONTACT COMPONENT

[75] Inventors: Tadahiro Ohmi, Sendai; Hitoshi Inaba, Machida, both of Japan

[73] Assignee: Takasago Netsugaku Kogyo Kabushiki Kaisha, Tokyo, Japan

[21] Appl. No.: 546,192

[22] Filed: Oct. 20, 1995

Related U.S. Application Data

[63] Continuation of Ser. No. 674,322, filed as PCT/JP90/00985, Aug. 2, 1990, abandoned.

[30] Foreign Application Priority Data

Aug. 18, 1989 [JP] Japan ................................ 1-212146

[51] Int. Cl.⁶ ................................................ B32B 15/04
[52] U.S. Cl. ................. 428/457; 148/566; 148/DIG. 118
[58] Field of Search ................................ 148/DIG. 116, 148/DIG. 117, DIG. 118, 525, 526, 565, 566; 428/457

[56] References Cited

U.S. PATENT DOCUMENTS

| | | | |
|---|---|---|---|
| 4,247,422 | 1/1981 | Davies | 252/465 |
| 4,491,622 | 1/1985 | Butt | 428/632 |
| 4,495,008 | 1/1985 | Bruno et al. | 148/31.5 |
| 4,500,611 | 2/1985 | Nickol et al. | 428/686 |
| 4,511,634 | 4/1985 | Nickol | 428/686 |
| 4,826,737 | 5/1989 | Yamada et al. | 428/650 |
| 5,264,394 | 11/1993 | Ruckman et al. | 148/DIG. 118 |

FOREIGN PATENT DOCUMENTS

3810594A1  10/1989  Germany .

OTHER PUBLICATIONS

"Wafer Handling Robotic End-of-Arm Tool For Operation in Clean Room Environments" Abstr. No. 30 759.

*Primary Examiner*—Michael Lusignan
*Attorney, Agent, or Firm*—Baker & Daniels

[57] ABSTRACT

An electrified object contact material characterized in that an oxide film formed in a high purity oxidizing atmosphere with a thickness from several tens to 100 Å is formed at least in a section directly contacting an electrified object. By using the contact component according to the present invention, the electric potential of a wafer can always be suppressed to 50 V or less, and moreover, contamination of a wafer (especially by a metallic material) can completely be eliminated.

8 Claims, 4 Drawing Sheets

ELECTRIFIED OBJECT CONTACT COMPONENT

This is a continuation of application Ser. No. 07/674,322, filed filed as PCT/JP90/00985 on Aug. 2, 1990 abandoned.

BACKGROUND OF THE INVENTION

This invention relates to an electrified object contact component.

In an LSI manufacturing process, electrification of a wafer is a big problem, and it is urgently required to establish a technology for prevention of electrification.

Description is hereunder made for troubles caused by electrification of a wafer, as an example of an electrified object.

As a wafer is generally handled with insulating fluororesin or quartz for preventing it from being contaminated, a very high electric potential is charged when the wafer contacts a contacting member while being handled. Results of measurement of electric potential in electrified wafers are shown in Table 1 below.

TABLE 1

| Electric potential in an electrified wafer (23 degrees Centigrade, 30–45%) |
| --- |
| When handled by a teflon forceps ... +500 V~+3300 V or more |
| When put on a polypropyrene stand ... +600 V~+2000 V |
| When a wafer is put on a quartz plate with a teflon forceps ... +1000 V~+1500 V |

A range of measurement by an electrometer=−3300 V~+3300 V

As shown by this result, it has turned out that, when a silicon wafer is handled by a resin material or quartz, always positive electricity is charged in the wafer because of the electrification column, and also that the electric potential is fairly high.

Also it has turned out that, when a wafer is electrified, the following two types of problems occur and cause substantial decrease in yield in a semiconductor manufacturing process;

① Adhesion of airborne particles due to static electricity force

② Destruction of a device due to discharge of static electricity

Results of a testing to investigate the problem ① and computing results for the trouble are introduced below. FIG. 1 shows a number of particles with a diameter of 0.5 µm or more which adhered to a surface of an electrified wafer when a 5-inch wafer was left on a conductive grating floor for 5 to 10 hours in a clean room in a vertical position with a 2 cm high insulating stand. The horizontal axis shows electric potentials in the wafer and the vertical axis shows a number of deposited particles (converted to a number of particles which adhered to a central area of a wafer when the wafer is left for 5 hours in the atmosphere with a density of 10 particles having a diameter of 0.5 µm or more/cf). As adhesion of particles due to gravity does not occur on a vertical surface, adhesion of particles is not observed when electric potential of a wafer is in a low range from 0 V to 50 V. In accordance with increase of electric potential of the wafer to 300 V or to 1800 V, the number of adhered particles sharply increases, which shows that the adhesion is caused by a static electricity force. FIG. 1 shows results of measurement of effects by static electricity force to relatively large particles, and generally as diameter of a particle becomes smaller, effects of this static electricity force become more visible acceleratingly. When electric potential of a wafer is at least below 50 V, any particle does not adhere to the wafer. Herein, a state where electric potential of a wafer is 50 V or below is defined as a state where electric potential of the wafer has been neutralized. FIG. 2 shows a range of movement of particles moved and adhered due to static electricity force on an effective section of a wafer calculated on the assumption that electric potential of the wafer is 1000 V and electric potential at the peripheral rectangular frame line is zero. As a force to make particles adhere to a wafer, only gravity (including buoyancy) and static electricity force are taken into account. Also it is assumed that the particle density is 1 g/cm$^3$. This drawing shows that particles in an area enclosed by oblique lines adhere to the effective section of the wafer. Results of the calculation show that an area where particles with the diameter of 2 µm or more adhere to is very narrow and virtually no particle adheres to the wafer. As a particle diameter becomes smaller to 0.5 µm or to 0.1 µm, the adhesion area sharply becomes larger, which indicates that, when diameter of a particle is small, effect of static electricity force over the particle in terms of adhesion to a surface of an object is very large.

Results of the experiment and calculation described above indicate that preventing a wafer from being electrified is very important for preventing a surface of the wafer from being contaminated by particles.

BACKGROUND TECHNOLOGY

Conventional art for preventing a wafer from being electrified is classified to the following two ways.

① Generating ions by means of corona discharge method and neutralizing an electrified wafer with the ions.

② Neutralizing electric charge in a wafer by handling the wafer with a grounded conductive resin material ③ Neutralizing electric charge in a wafer by handling the wafer with a grounded metallic material.

However, all of these techniques have defects which may be fatal in the age of submicron ULSI, and unless these defects are removed, they are not applicable for neutralization of enhanced wafers.

It has turned out that the corona discharge in ① above has the following problems.

(1) Generation of corpuscles from a tip of a discharging electrode.

(2) Generation of ozone.

This inventor investigated a cause for (1), and found out that spattering due to ions occurs at a tip of a discharging electrode and corpuscles are generated because of this phenomenon. FIG. 3 shows numbers of ions and corpuscles (≧0.17 µm) generated when spark discharge is performed by using a tungsten needle. The numbers of generated ions and corpuscles vary according to strength of loaded discharge current, and when a current value is 1 mA, plus ions are generated at a rate of 200 millions pcs/sec with particles with a diameter of 0.17 µm or more generated at a rate of 1960 pcs/sec. It is conceivable that particles with smaller diameter are generated at a higher rate. As this experiment result shows a case of spark discharge, it is conceivable that a quantity of dust generated in corona discharge would be smaller. But, as spattering, which is the same phenomenon as that in case of spark discharge, occurs, the possibility of dust generation can not be denied.

Then, ozone in (2) is generated when air is electrolytically dissociated, and as ozone's oxidizing effect is very strong, an oxidized film is rapidly formed on a surface of a wafer, which causes various troubles. Also, it has turned out that high polymer materials often used as, for instance, coating material for power cables are dissolved by ozone, which causes many troubles such as insulation fault. Unless these problems are solved, an electrified surface neutralizing method making use of ions generated by means of corona discharge can not be applied to wafers.

In the method (2), a conductive substance mixed with a resin material is a source of contaminants for wafers. Generally carbon or metal is used as a substance to be mixed with. When the substance contacts a wafer, the impurities adhere to the wafer, which causes a dark current or a leak current.

Also in the method (3), like in the method (2), conductive metal contacts a wafer, which may generate a dark current or a leak current (contamination by metal) causing severe contamination, so that the method is not applicable for production of wafers unless it is improved.

SUMMARY OF THE INVENTION

An electrified object contact component according to the present invention is characterized in that an oxide film with a thickness from several tens to 100 Å formed in high purity oxidizing atmosphere has been formed at least in a section which contacts an electrified object.

The electrified object herein includes, for instance, a wafer.

Also, the contact component herein includes, for instance, a wafer manipulator, a wafer mount in a reaction chamber, and a wafer carrier in a wafer transfer tunnel.

FUNCTION

Description is made hereunder for working as well as detailed composition of the present invention.

At first, description is made for formation of an insulating layer.

An oxide film with a thickness from several tens to 100 Å is formed by oxidizing metal, a surface thereof having been processed by electropolishing or other appropriate technics to a mirror surface (preferably with an Rmax of 1 μmm or less) without any affected zone due to the processing, in high purity oxidizing atmosphere having a very low moisture density (of preferably 10 ppb or less, or more preferably several ppb or less). This oxidizing process is called field assist oxidation, wherein molecular oxygen adhered to a metal surface is ionized to a negative ion ($O_2$—) and the negative ion is pulled through the oxide film into an interface between the oxide film and the metal, reacting to the metal and forming an oxide film. In this oxidation process, if there are few impurities (especially $H_2O$), the oxide film formed there has a very minute construction having a surface with low degassing properties and high abrasion resistance as well as high chemical resistance. A thickness of an oxide film largely depends on the metallic material and temperature applied for the oxidization processing, and for instance, in case of stainless steel (316L), a film thickness formed under a temperature of 350 degrees Centigrade is in a range from 50 to 60 Å, and that formed under a temperature of 380 degrees Centigrade is in a range from 70 to 80 Å. A time required for the oxidization processing is in a range from 1–9 hours. By using a metallic material having a surface oxidized as described above for handling a wafer, an electric charge in an electrified wafer can be neutralized because of the tunnel effect in an oxide film. The electric charge neutralizing mechanism making use of the tunnel effect can be explained as follows. When a positively electrified silicon wafer contacts a surface of a metallic material covered with said oxide insulating film, as many electrons are used for neutralization, electrons are supplied from the side of a metallic material earthed to the ground in a quantity equivalent to that of electrons used for neutralization so that an existence probability of electrons beyond an insulating film is maintained at a constant level. To the contrary, if a wafer is electrified negatively, an existence probability of electrons is maintained at a constant level by making surplus electrons in the wafer flow to the side of a metallic material. Thus, finally electrons remain in the wafer contacting a metallic material having a surface oxidized through the processing as described above according to a probability defined by a thickness of an oxide film and an electric potential of the wafer becomes extremely low.

On the other hand, as an metallic oxide film processed by means of the field assist oxidation in oxygen atmosphere containing few impurities (especially $H_2O$) has insulating properties and also its abrasion resistance is high even if it contacts a wafer, contamination by a metallic material due to contact abrasion does not occur, which is different from conventional cases. Namely, this characteristics means that a metallic material with said metallic oxide film with its low probability to cause contamination of a wafer is equivalent to conventional wafer handling materials made of quartz or fluororesin.

Herein, 1 is an electrified object (wafer), 2 is a metallic material having an oxidized surface, 3 is a manipulator, 4 is a ground, 5 is a metallic material having an oxidized surface (wafer mount), 6 is a wafer, 7 is a wafer reaction chamber, 8 is a ground, 9 is a wafer transfer tunnel, 10 is a metallic material having an oxidized surface (wafer carrier), 11 is a wafer, and 12 is a ground.

DESCRIPTION OF THE PREFERRED EMBODIMENTS

Figure 1:
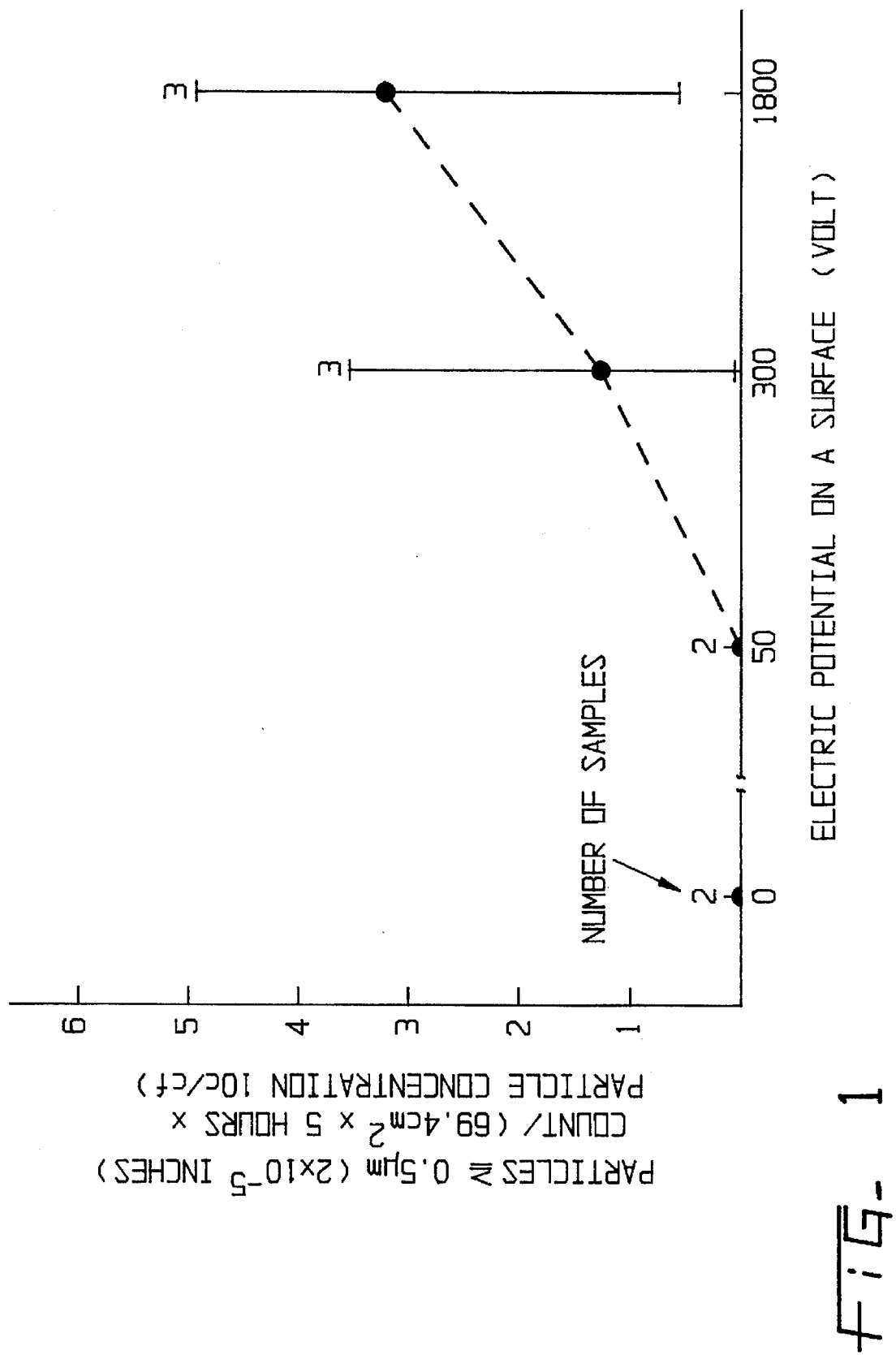
FIG. 1 is a graph which shows results of an experiment concerning adhesion of particles to an electrified wafer.
Figure 2C:
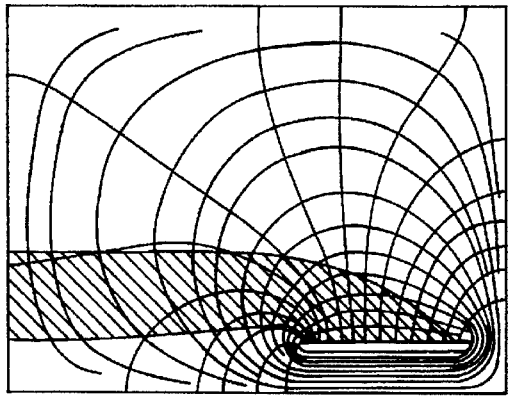
FIG. 2 is a distribution diagram which shows results of a calculation concerning adhesion of particles to an electrified wafer.
Figure 2B:
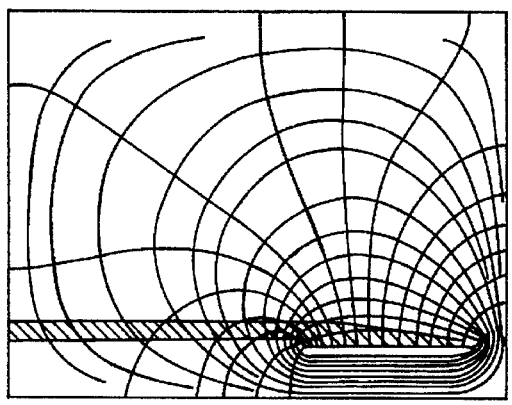
Figure 2A:
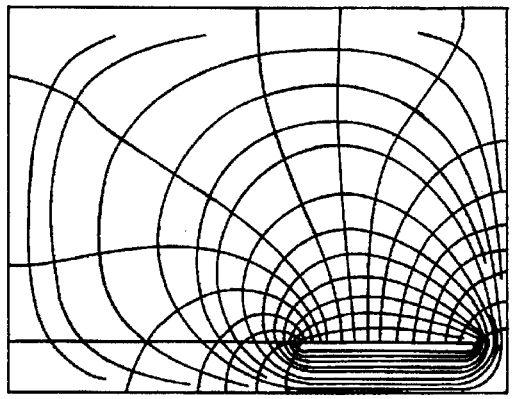
Figure 3:
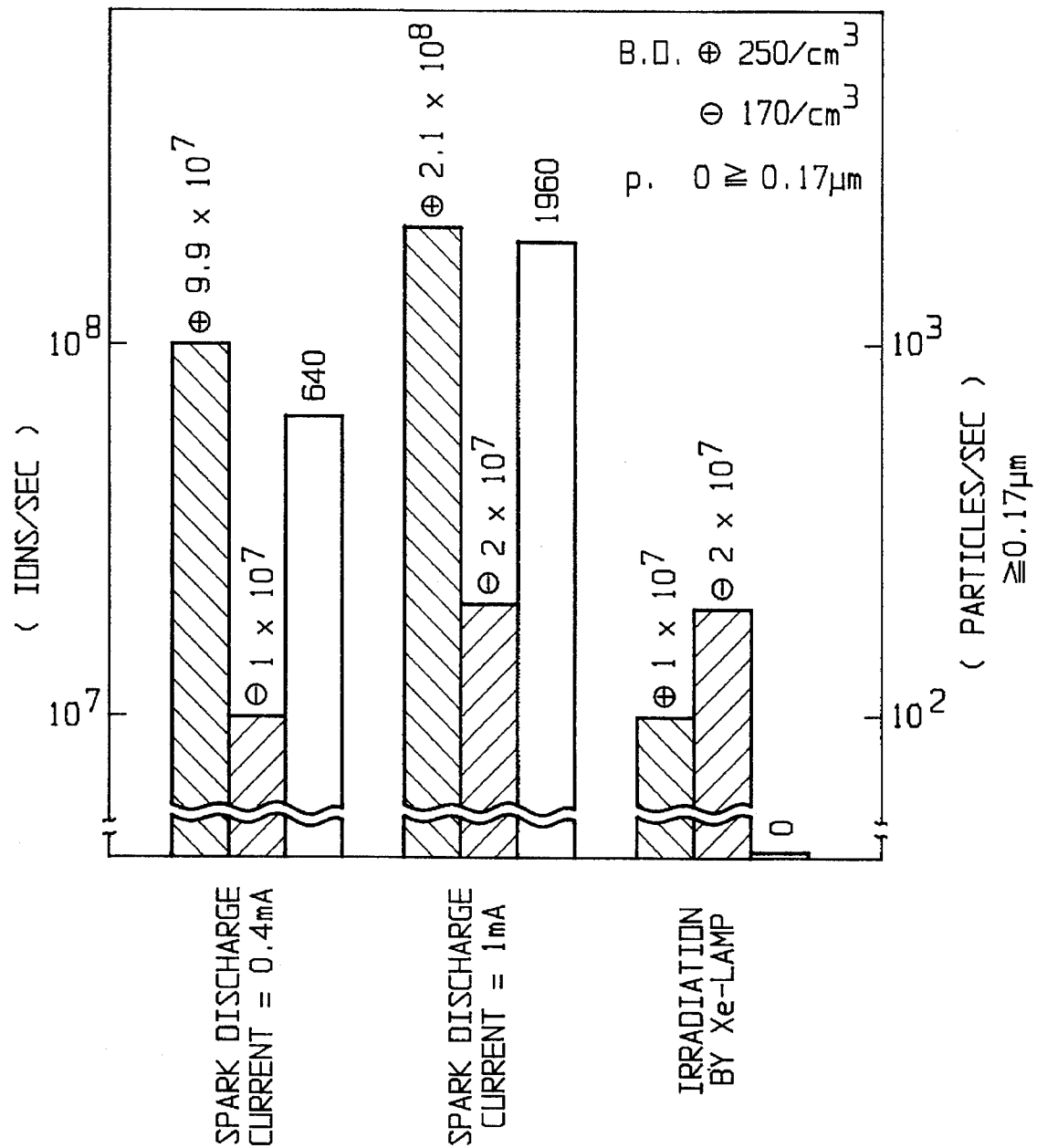
FIG. 3 is a graph which shows numbers of ions and corpus generated by means of an ion generating method making use of electric discharge and by means of an ion generating method making use of an photoelectric effect.
Figure 4A:
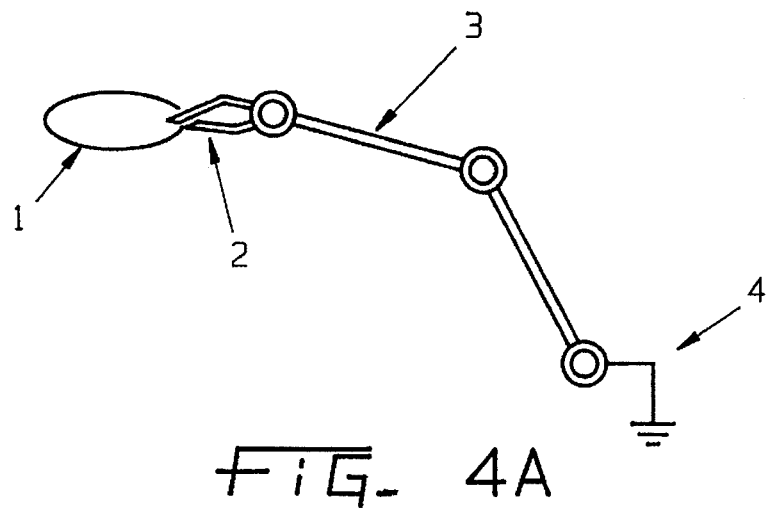
FIGS. 4a, 4b and 4c are stereoscopic drawings showing applications of said contact component according to the present invention.
Figure 4B:
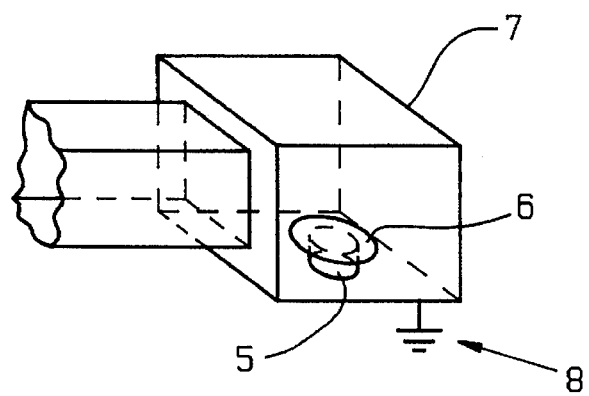
Figure 4C:
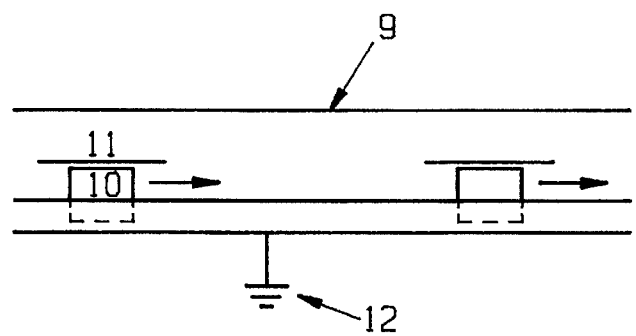

The contact component according to an embodiment of the present invention is shown in FIG. 4. Herein, (a) is a manipulator for wafer handling, wherein at least a metallic material having an oxidized surface is used for a section directly contacting a wafer and electrification of a wafer is prevented by means of grounding. (b) shows a case wherein the metallic material having an oxidized surface is used for the wafer mount 5 in a wafer reaction chamber. Namely, the wafer mount is made of metal with an oxide film formed on a section directly contacting a wafer. Also in this case, as the chamber is made of metal, grounding is provided at a point as shown in this figure. (c) shows a case wherein the wafer transfer tunnel is all metallic and a metallic material having an oxidized surface is used in a section of the wafer transfer tunnel 10 directly contacting a wafer. Balance of electrons is controlled, as shown in this drawing, by grounding the wafer transfer tunnel for preventing a wafer from being electrified.

In the three embodiments of the present invention described above, a thickness of an oxide film layer of a metallic material having an oxidized surface is in a range from several tens to 100 Å, and electric potential of each wafer can be suppressed to 50 V or below in any processing, and even if particles exist around a wafer, adhesion of the particles to the wafer surface does not occur.

By using the contact component according to the present invention, electric potential of a wafer can always be suppressed to 50 V or below, and additionally contamination of a wafer (especially by a metallic material) can completely be eliminated.

We claim:

1. A contact member for one of manipulating and supporting an electrically charged semiconductor material, said contact member including a metal surface for contacting said semiconductor material, said contact member formed by the process of forming an oxide film on at least a portion of said metal surface in a pure oxidizing atmosphere, said film having a thickness of about ten to one hundred Angstroms.

2. The contact member according to claim 1, wherein the surface roughness of said metal surface is $\leq 1$ μm.

3. The contact member according to claim 2, wherein the impurity concentration in said oxidizing atmosphere is less than 10 ppb.

4. The contact member according to claim 1, wherein said portion of said metal surface is connected to electrical ground.

5. A method for making a contact member for one of manipulating or supporting an electrically charged semiconductor material, the method comprising:

providing a contact member with a metal surface; and forming an oxidation film having a thickness of about ten to one hundred Angstroms on at least a portion of said metal surface in a pure oxidizing atmosphere having low moisture density.

6. The method for making a contact member according to claim 5, wherein the providing step includes providing a metal surface with a surface roughness $\leq 1$ μm.

7. The method for making a contact member according to claim 6, wherein the forming stem uses an impurity concentration in said oxidizing atmosphere which is less than 10 ppb.

8. The method for making a contact member according to claim 5, further comprising the step of connecting a portion of said metal surface to electrical ground.

* * * * *